US012414269B2

(12) United States Patent
Patankar et al.

(10) Patent No.: US 12,414,269 B2
(45) Date of Patent: Sep. 9, 2025

(54) INTERLEAVED HETEROGENEOUS HEAT PIPES WITH DIFFERENT $Q_{max}$

(71) Applicant: Intel Corporation, Santa Clara, CA (US)

(72) Inventors: Gaurav Patankar, Chandler, AZ (US); Ruander Cardenas, Portland, OR (US); Mark MacDonald, Beaverton, OR (US); Akhilesh P. Rallabandi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 975 days.

(21) Appl. No.: 17/090,624

(22) Filed: Nov. 5, 2020

(65) Prior Publication Data

US 2021/0059073 A1    Feb. 25, 2021

(51) Int. Cl.
| | | |
|---|---|---|
| *H05K 7/20* | (2006.01) | |
| *F28D 15/02* | (2006.01) | |
| *F28D 15/04* | (2006.01) | |
| *G06F 1/20* | (2006.01) | |
| *H01L 23/427* | (2006.01) | |

(52) U.S. Cl.
CPC ..... *H05K 7/20336* (2013.01); *F28D 15/0275* (2013.01); *F28D 15/04* (2013.01); *H01L 23/427* (2013.01); *G06F 1/20* (2013.01)

(58) Field of Classification Search
CPC ............ H05K 7/2029; H05K 7/20336; H05K 7/2039; H05K 7/20409; H05K 7/20536; H05K 7/20663; F28D 2015/0216; F28D 2015/0225; F28D 2021/0028; F28D 2021/0029; H01L 2023/4037; H01L 2023/4068
See application file for complete search history.

(56) References Cited

U.S. PATENT DOCUMENTS

| | | | |
|---|---|---|---|
| 6,595,270 B2 * | 7/2003 | Machiroutu | ........ F28D 15/0275 174/15.2 |
| 8,395,898 B1 * | 3/2013 | Chamseddine | ....... F28D 7/0075 361/695 |

(Continued)

OTHER PUBLICATIONS

Pandev, Rossen; "Inside Dell XPS 15 (9560)—disassembly, internal photos and upgrade options," Laptopmedia.com, Mar. 28, 2017.

(Continued)

*Primary Examiner* — Jayprakash N Gandhi
*Assistant Examiner* — Steven Ngo
(74) *Attorney, Agent, or Firm* — Alliance IP, LLC

(57) ABSTRACT

Heterogeneous heat pipe solutions provide both low thermal resistance and a high $Q_{max}$. Some heterogeneous heat pipe solutions comprise multiple homogenous heat pipes operating in parallel, with each homogeneous heat pipe having its thermal performance tailored to handle a processor operating in a particular power mode. Other heterogeneous heat pipe solutions comprise one or more heterogeneous heat pipes, each heterogeneous heat pipe having more than wick, each wick having a different set of wick characteristics (wick material, wick thickness, etc.). Heterogeneous heat pipes can provide a thermal management solution for processors over their full operating power range.

11 Claims, 8 Drawing Sheets

(56) References Cited

U.S. PATENT DOCUMENTS

| | | | |
|---|---|---|---|
| 2008/0151505 A1* | 6/2008 | Chen | H01L 23/4006 |
| | | | 257/E23.084 |
| 2009/0236077 A1* | 9/2009 | Xu | F28D 1/0472 |
| | | | 165/80.3 |
| 2010/0270007 A1* | 10/2010 | Lin | F28D 15/0233 |
| | | | 165/80.2 |
| 2012/0160456 A1* | 6/2012 | Aoki | H01L 23/427 |
| | | | 165/104.26 |
| 2013/0000871 A1* | 1/2013 | Olson | H05K 7/20336 |
| | | | 713/300 |
| 2016/0128227 A1* | 5/2016 | Gernert | H05K 7/2039 |
| | | | 165/104.21 |
| 2019/0014689 A1* | 1/2019 | Yu | F28F 3/12 |
| 2019/0383528 A1* | 12/2019 | Sung | F25B 21/02 |
| 2020/0029784 A1* | 1/2020 | Thiyagarajan | A47L 15/488 |
| 2020/0355443 A1* | 11/2020 | Tochigi | F28D 15/0275 |
| 2020/0386490 A1* | 12/2020 | Huang | F28F 1/32 |
| 2020/0390003 A1* | 12/2020 | Kawabata | H05K 7/20163 |
| 2020/0391266 A1* | 12/2020 | Moore | B21C 35/023 |
| 2021/0204444 A1* | 7/2021 | Stefanoski | H01L 23/473 |
| 2022/0004235 A1* | 1/2022 | Jin | H05K 7/20336 |

OTHER PUBLICATIONS

Walker-Todd, Alex; "Asus ROG Zephyrus G14 review," Tech Advisor, Jun. 8, 2020. (9 pgs.).

\* cited by examiner

INTERLEAVED HETEROGENEOUS HEAT PIPES WITH DIFFERENT $Q_{max}$

BACKGROUND

Heat pipes are commonplace in existing computing devices and help keep them within their operating limits. The maximum heat carrying capacity of a heat pipe, $Q_{max}$, is limited, particularly in the thin form factors that lead the mobile client device market. A heat pipe's $Q_{max}$ is positively correlated to its thermal resistance. Increasing the $Q_{max}$ of a heat pipe increases its thermal resistance and vice versa.

DETAILED DESCRIPTION

Figure 1A:
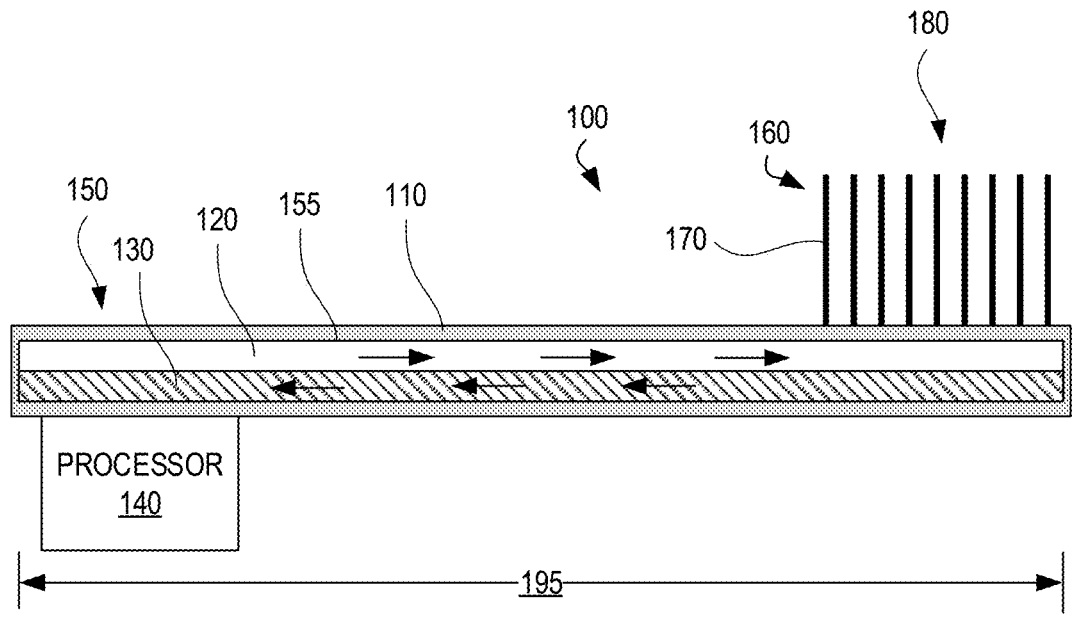
FIGS. 1A and 1B illustrate longitudinal and transverse cross-sectional views, respectively, of a heat pipe.

Two parameters that relate a heat pipe's thermal performance are its thermal resistance, which is a measure of how easily a heat pipe can remove heat, and $Q_{max}$, the maximum amount of heat a heat pipe can carry. As modern processors can operate over a greater power range than processors of just a few generations ago, in part due to their ability to exceed their maximum steady state power rating for very short periods, they should be connected to heat pipes with a sufficient $Q_{max}$ to handle this increased power range. However, the thermal resistance and $Q_{max}$ of a heat pipe are inversely related. Increasing a heat pipe's $Q_{max}$ to accommodate a processor's maximum power levels increases its thermal resistance, which impacts the ability of the heat pipe to remove heat at all power levels. The heterogeneous heat pipe solutions disclosed herein have a high enough $Q_{max}$ to handle the full operating range of modern processors while still providing a heat pipe solution with low thermal resistance. This solution is a useful one as client mobile computing devices rely more and more upon short-term high-performance processor modes to achieve year-over-year performance gains.

In the following description, specific details are set forth, but embodiments of the technologies described herein may be practiced without these specific details. Well-known circuits, structures, and techniques have not been shown in detail to avoid obscuring an understanding of this description. "An embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner "Connected" may indicate elements are in direct physical or electrical contact with each other and "coupled" may indicate elements co-operate or interact with each other, but they may or may not be in direct physical or electrical contact. Terms modified by the word "substantially" include arrangements, orientations, spacings, or positions that vary slightly from the meaning of the unmodified term. For example, a wick that extends substantially to a first end of a heat pipe may not extend to the very end of the heat pipe.

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to embodiments of the present disclosure, are synonymous.

Reference is now made to the drawings, wherein similar or same numbers may be used to designate same or similar parts in different figures. The use of similar or same numbers in different figures does not mean all figures including similar or same numbers constitute a single or same embodiment. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form to facilitate a description thereof. The intention is to cover all modifications, equivalents, and alternatives within the scope of the claims.

Figure 1B:
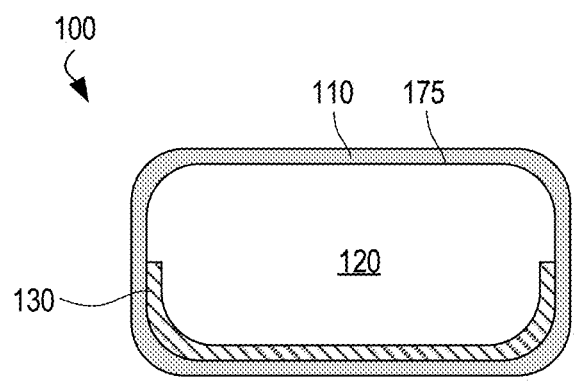

FIGS. 1A and 1B illustrate longitudinal and transverse cross-sectional views, respectively, of a heat pipe. The heat pipe 100 comprises a casing 110 that contains a chamber 120 and a wick 130. The heat pipe 100 is thermally coupled to a processor 140 at a first end (or "hot end") 150 of the heat pipe 100 and thermally coupled to a heat sink 160 at a second end (or "cold end") 180 of the heat pipe. Generally, a heat pipe transfers heat from a heat source (an evaporator) to a heat sink (a condenser) through vaporization and condensation of a working fluid. The heat pipe 100 transfers heat from the processor 140 (the evaporator) to the heat sink 160 (the condenser) through vaporization and condensation of the working fluid container in the chamber 120. Heat generated by the processor 140 vaporizes the working fluid in its liquid form at the hot end 150 and the cooling of the working fluid by the heat sink 160 at the cold end 180 causes the working fluid in its gaseous form to condense. The vaporized working fluid flows from the hot end 150 to the cold end 180 due to the vapor pressure difference between the working fluid at the hot and cold ends. The condensed working fluid flows from the cold end 180 back to the hot end 150 via capillary action.

In some embodiments, the casing 110 can be made of copper or aluminum and the working fluid can be water, methanol, ammonia, or ethanol. The wick 130 can comprise sintered copper powder, copper fibers (which, in some embodiments, can be woven into forms such as a screen, mesh, or braids), or grooves integrated into the heat pipe 100. The wick 130 is located along a portion of an inner face 155 of the heat pipe 100. That is, the wick 130 can be located along the entire distance of a longitudinal length 195 of the inner face of the heat pipe 100 or along just a portion of the longitudinal length 195. The wick 130 can also be located along the entire length of an inner perimeter 175 of the heat pipe 100 or along just a portion of the inner perimeter 175 (as shown in FIG. 1B). In some embodiments, where the heat pipe cools electronic components, the heat pipe 100 comprises a copper casing with water as the working fluid and a sintered copper powder and copper fiber wick. In some embodiments, a thermal interface material (TIM) can be located between the processor 140 and the heat pipe 100 to aid in the conduction of heat between the two components. In some embodiments, the heat pipe 100 is thermally coupled to the heat sink 160 by being directly attached to the heat sink 160, such as by being soldered to the heat sink 160.

The processor 140 can be any type of processor used in any type of computing device described or referenced herein, such as a client or server CPU (central processor unit), GPU (graphics processing unit), DSP (digital signal processors), or AI (artificial intelligence) or any other type of accelerator. Heat pipes can also be used to cool other types of electronic components capable of generating heat, such as memories, storage devices, network interface controllers, and I/O (input/output) controllers. The heat sink 160 comprises a plurality of fins 170 and in other embodiments, a heat sink can comprise pins or other thermally conductive structures capable of transporting heat from the cold end 180 of the heat pipe to the surrounding environment. In some embodiments, a fan (not shown) can blow air heated by the heat sink to the external environment. In some embodiments, a heat pipe can be connected to multiple heat sources and/or multiple heat sinks. The heat pipe 100 is illustrated as being straight but in some embodiments, the heat pipe can comprise one or more bends as it travels from the hot end to the cold end. In some embodiments, multiple heat pipes of the same type can transfer heat from a heat source to a heat sink. As can be seen in FIG. 1B, the heat pipe 100 has a flattened transverse cross-sectional profile. In other embodiments, a heat pipe can have a circular, elliptical, rectangular, or other transverse cross-sectional profile, including flattened profiles that are more flattened (i.e., have a greater width-to-height ratio) than what is shown in FIG. 1B.

As mentioned earlier, two parameters that characterize the thermal performance of heat pipes are its $Q_{max}$ and thermal resistance. $Q_{max}$ is the maximum heat carrying capacity of a heat pipe and is typically determined by the heat pipe's capillary limit. The capillary limit is the maximum amount of heat that a heat pipe can carry and still return the condensed working fluid by capillary action in the wick. That is, the capillary forces of the wick are still able to overcome the sum of the pressure drops in the heat pipe. The pressure drops in a heat pipe include the pressure drop due to gravity, the liquid pressure drop in the wick, and the vapor pressure drop in the heat pipe. In some embodiments, $Q_{max}$ is determined by a heat pipe's vapor limit, which can depend on the heat pipe's transverse cross-sectional area. Heat pipes with a larger transverse cross-sectional area can have a larger vapor limit, and heat pipes with larger transverse cross-sectional areas and whose $Q_{max}$ is limited by its vapor limit can thus have a larger $Q_{max}$. A heat pipe can be tailored to perform best when a processor is operating at a particular power consumption level, such as in a maximum steady state (i.e., TDP (Thermal Design Power) for Intel® processors) or a short-term high-performance state (i.e., a PL2 "turbo" mode for Intel® processors). However, due to the trade-off between a heat pipe's thermal resistance and $Q_{max}$, a heat pipe cannot perform optimally for multiple processor power levels.

This trade-off between thermal resistance and $Q_{max}$ can be adjusted by various heat pipe parameters such as the physical dimensions of the heat pipe, wick type, wick thickness, and working fluid charge level (how much of the heat pipe is filled with the working fluid before the heat pipe is sealed). As mentioned previously, the various types of wicks that can be used in heat pipes include sintered copper powder, copper fibers, or grooves. Sintered copper powder has a power density of less than 500 W/cm$^2$ and a thermal conductivity in the range of 0.03-0.15° C./W/cm$^2$; copper fibers have a power density of less than 30 W/cm$^2$ and a thermal conductivity in the range of 0.15-0.25° C./W/cm$^2$, and grooves have a power density of less than 20 W/cm$^2$ and a thermal conductivity in the range of 0.22-0.35° C./W/cm$^2$. If the amount of heat moved through a heat pipe exceeds $Q_{max}$, the thermal resistance of the pipe can increase by an order of magnitude or more.

In some embodiments, heterogeneous heat pipe solutions comprise multiple heat pipes that, when combined, provide for an overall thermal performance that is better than that of a homogeneous heat pipe solution consisting of one or more heat pipes of the same type. For example, in some embodiments, a heterogeneous heat pipe can comprise a first heat pipe with a low thermal resistance operating in parallel with a second heat pipe with high $Q_{max}$ such that the overall heterogeneous heat pipe solution has a low thermal resistance and a high $Q_{max}$.

Figure 2:
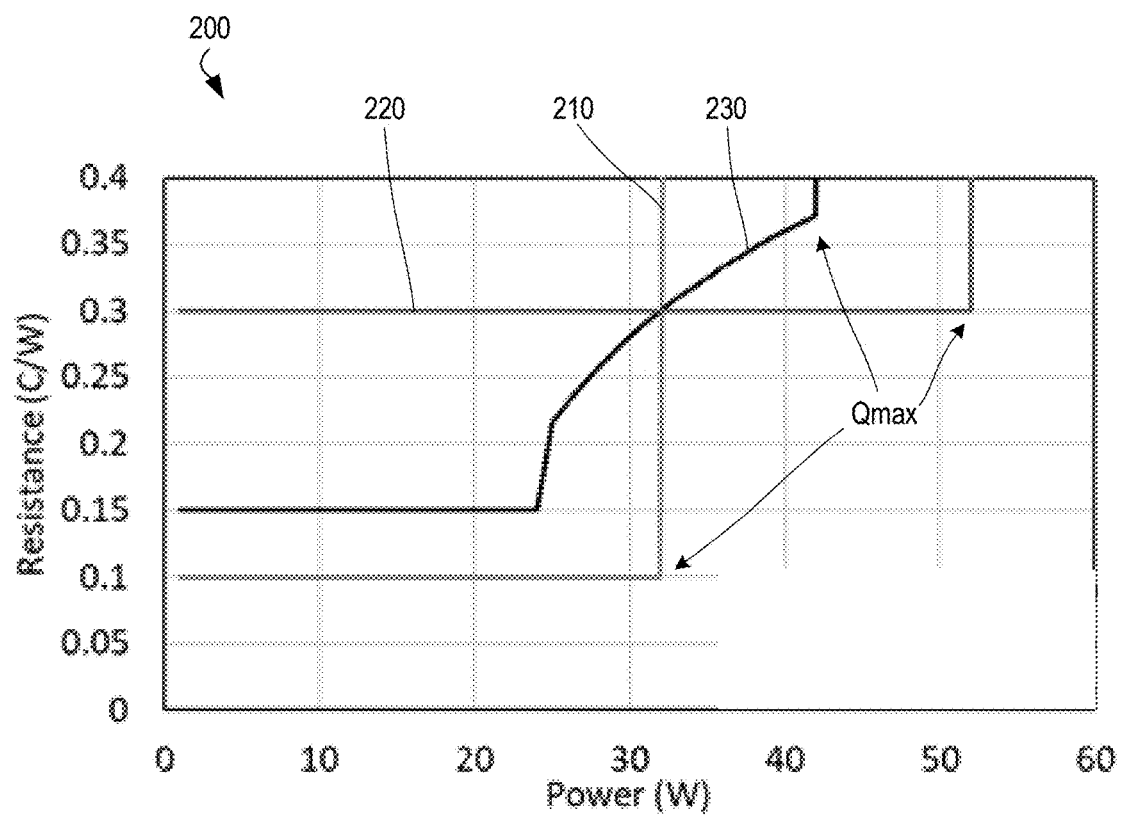
FIG. 2 illustrates a graph showing steady state thermal performance of a first exemplary heterogeneous heat pipe solution and two homogeneous heat pipe solutions.

FIG. 2 illustrates a graph showing steady state thermal performance of a first exemplary heterogeneous heat pipe solution and two homogeneous heat pipe solutions. The graph 200 shows the change in heat pipe thermal resistance as a function of the amount of power being transported by the heat pipe. Curve 210 corresponds to a first homogeneous heat pipe solution comprising two heat pipes in parallel with each heat pipe having a thermal conductivity of 0.2° C./W and a $Q_{max}$ of 16 W. Curve 220 corresponds to a second homogeneous heat pipe solution comprising two heat pipes in parallel with each heat pipe having a thermal resistance of 0.6° C./W and a $Q_{max}$ of 26 W. Curve 230 corresponds to a heterogeneous heat pipe solution comprising a homogeneous heat pipe from the first homogeneous heat pipe solution in parallel with a homogeneous heat pipe from the second homogeneous heat pipe solution. For the steady state analysis illustrated in FIG. 2, the effective thermal resistance of the two heat pipes was computed by considering the heat pipes as parallel resistors. This approach is an approximate representation of actual heat pipe physics, but the curves shown in FIG. 2 match experimentally observed trends for the homogeneous heat pipe solutions.

The first homogeneous heat pipe solution (curve 210) has the lowest thermal resistance (0.1° C./W) of the three solutions and the lowest $Q_{max}$ (32 W). The second homogeneous heat pipe solution (curve 220) has the highest thermal resistance (0.3° C./W) and a $Q_{max}$ of 52 W. The heterogeneous heat pipe solution has a thermal resistance at low power levels (0.15° C./W) that is lower than the thermal resistance of the high-$Q_{max}$ homogeneous heat pipe solution and has a $Q_{max}$ of 42 W, which is greater than the $Q_{max}$ of the low-thermal resistance homogeneous heat pipe solution. Thus, a homogeneous heat pipe solution comprising dissimilar heat pipes operating in parallel can provide a low thermal resistance over a lower range of powers while also supporting high maximum heat-carrying levels.

Figure 3:
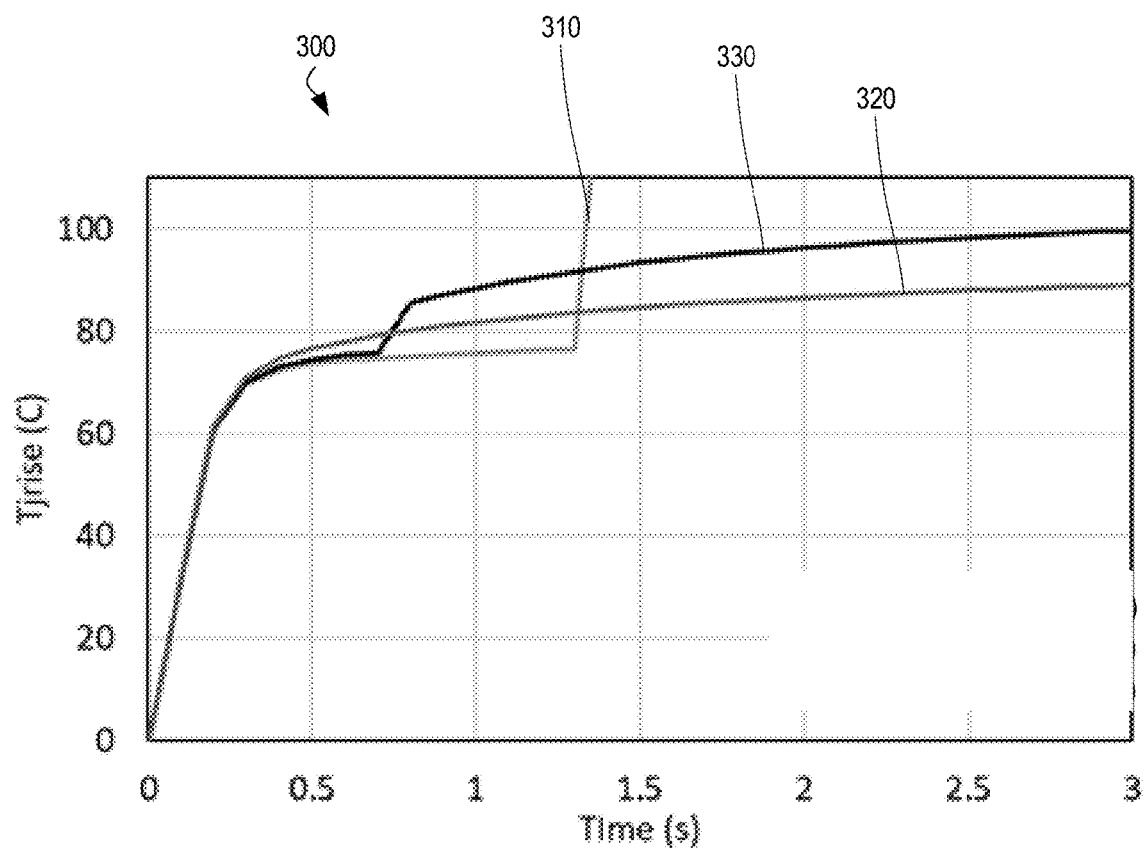
FIG. 3 illustrates a graph showing transient thermal performance for the heat pipe solutions characterized in FIG. 2.

FIG. 3 illustrates a graph showing transient thermal performance for the heat pipe solutions characterized in FIG. 2. The graph 300 compares the rise in junction temperature ($T_{jrise}$) of a processor in response to a step change in power consumption from 0 W to 50 W. The transient responses illustrated in the graph 300 were calculated using an RC network representation of each of the three heat pipe solutions. Curve 310 corresponds to the first homogeneous heat pipe solution and shows that the heat pipe solution with the lowest thermal resistance has the smallest increase in junction temperature. However, the first homogeneous heat pipe solution undergoes critical failure after one second due to its low $Q_{max}$. Curve 320 corresponds to the second homogeneous heat pipe solution. The second homogeneous heat pipe solution does not break down due to its higher $Q_{max}$ but results in a higher junction temperature increase due to its higher thermal resistance. Curve 330 corresponds to the heterogeneous heat pipe solution. The heterogeneous heat pipe solution does not break down and keeps the junction temperature increase to low values, similar to that of the first homogeneous heat pipe solution, for a time period shortly after the step increase in power. Thus, a heterogeneous heat pipe solution comprising a first heat pipe with low thermal resistance and a low $Q_{max}$ operating in parallel with a second a heat pipe with high thermal resistance and a high $Q_{max}$ exhibits both low thermal resistance and high $Q_{max}$ properties.

The improved thermal performance provided by heterogeneous heat pipes can benefit processors operating bursty workloads characterized in part by high power consumption spikes over very short time scales. Heterogeneous heat pipes can protect processors running such workloads by keeping the junction temperature increase small while being able to handle the short-term high power levels. Thus, these heterogeneous heat pipe solutions can be part of a thermal management solution that allows modern processors to operate over their full dynamic power range in thin form factor devices, such as mobile client devices.

Figure 4A:
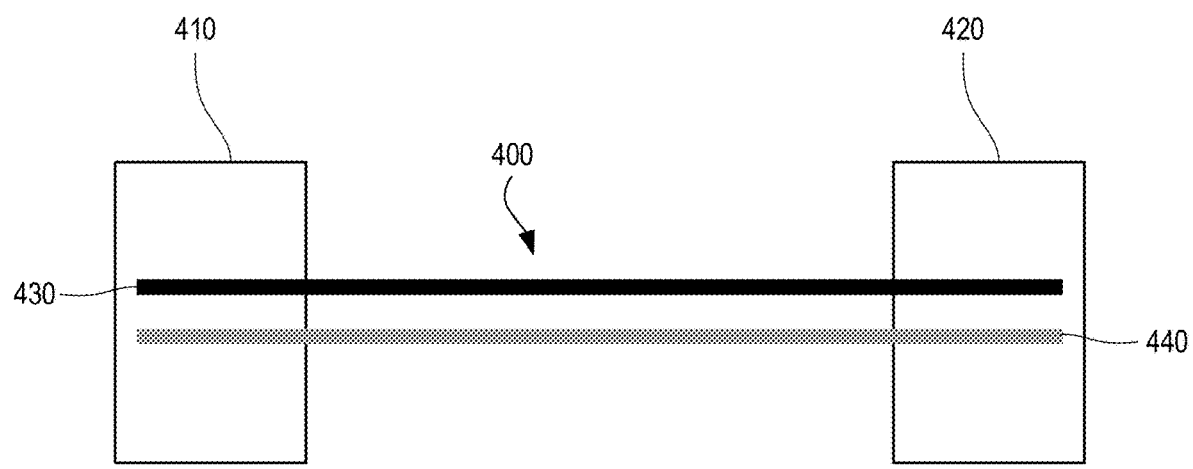
FIGS. 4A-4D illustrate block diagrams of second, third, fourth, and fifth exemplary heterogeneous heat pipe solutions.

FIGS. 4A-4D illustrate block diagrams of second, third, fourth, and fifth exemplary heterogeneous heat pipe solutions. FIG. 4A shows a heterogeneous heat pipe solution 400 connecting a processor 410 to a heat sink 420. The heterogeneous heat pipe solution 400 comprises a first heat pipe 430 and a second heat pipe 440. The first heat pipe 430 has a lower thermal resistance and lower $Q_{max}$ relative to the second heat pipe 440. The differing thermal characteristics of the first heat pipe 430 in relation to the second heat pipe 440 can be due to one or more different physical characteristics between the first and second heat pipes, such as heat pipe cross-sectional area, wick material, wick thickness, case material, working fluid, and working fluid charge level. In some embodiments, the thermal performance of the first heat pipes can be tailored for when the processor 410 is operating in a first mode and the thermal performance of the second heat pipe can be tailored for when the processor 410 is operating in a second mode. The first and second heat pipes can be tailored by, for example, having similar heat pipe characteristics but different working fluid charge levels. The charge levels can be determined by a processor mode that each heat pipe is tailored to. The first heat pipes can have a working fluid charged to a charging level that corresponds to a first processor mode (such as a maximum steady state mode) and the second heat pipes can have a working fluid charged to a charging level that corresponds to a second processor mode (such as a short-term high-performance mode).

Figure 4B:
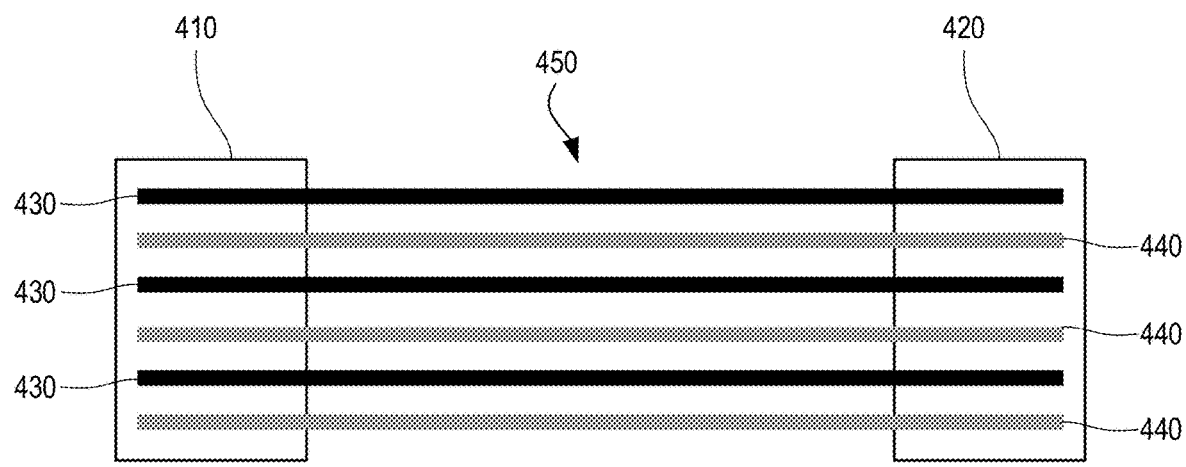
Figure 4C:
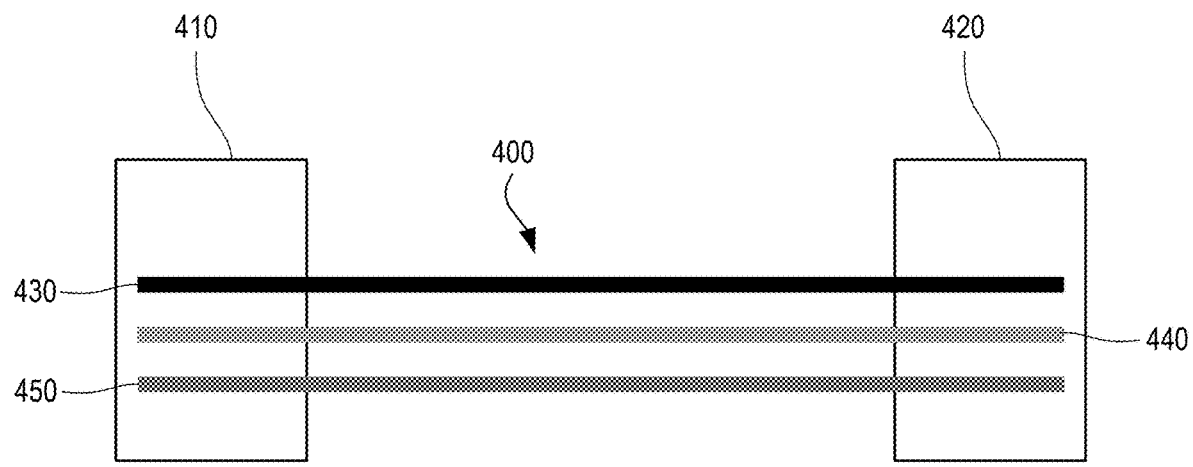
Figure 4D:
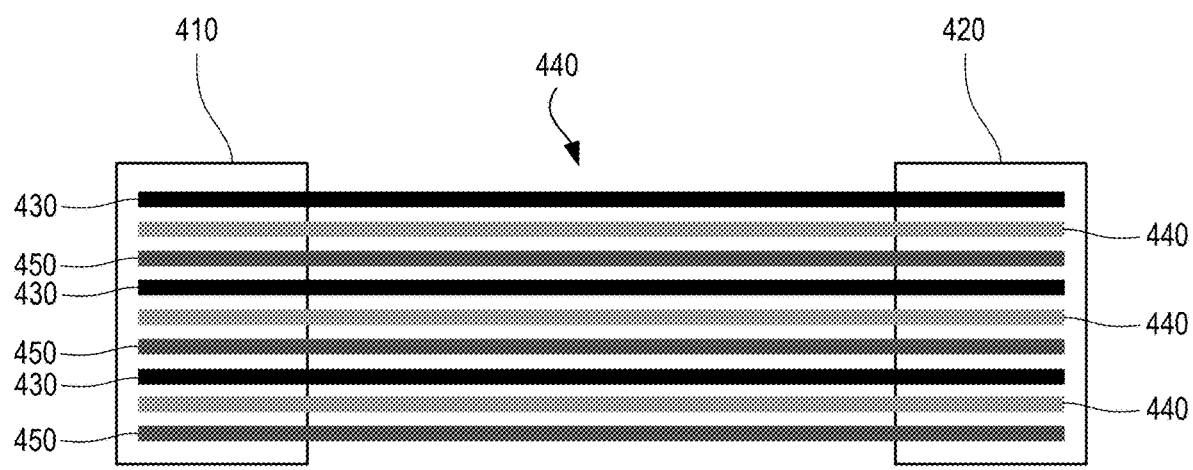

FIG. 4B illustrates a heterogeneous heat pipe solution 450 connecting the processor 410 to the heat sink 420 and comprising three first heat pipes 430 and three second heat pipes 440. The first heat pipes 430 and the second heat pipes 440 are shown as being interleaved but in other embodiments, they can be arranged in a non-interleaved fashion. In some embodiments, more than two types of heat pipes can be used in a heat pipe solution. For example, in some embodiments, a heat pipe solution can comprise one or more third pipes that have a thermal resistance and $Q_{max}$ different than the first and second heat pipes. The one or more third heat pipes can be in parallel with the first and second heat pipes, as illustrated in FIG. 4C (with third heat pipes 450 having a thermal resistance and $Q_{max}$ different than that of the first heat pipes 430 and the second heat pipes 440, the third heat pipes in parallel with the first heat pipes 430 and the second heat pipes 440), and in some embodiments, can be interleaved with the first and second heat pipes, as illustrated in FIG. 4D (with third heat pipes 450 interleaved with the first heat pipes 430 and the second heat pipes 440). In some embodiments, the third heat pipes can have thermal characteristics tailored for a processor mode different than those for which the first heat pipes and the second pipes are tailored. For example, the thermal performance of the third heat pipes can be tailored for a second short-term high-performance processor mode of operation.

Figure 5A:
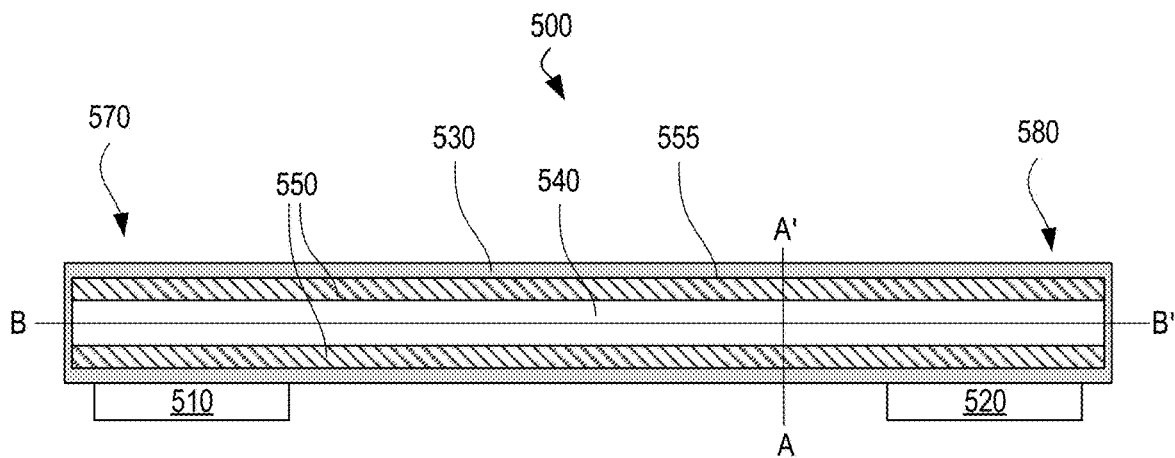
FIGS. 5A-5C illustrate various cross-sectional views of a sixth exemplary heterogeneous heat pipe.
Figure 5B:
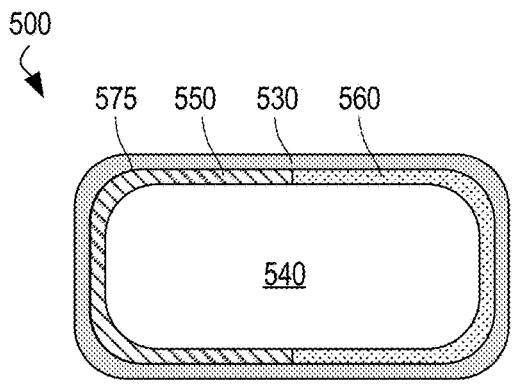
Figure 5C:
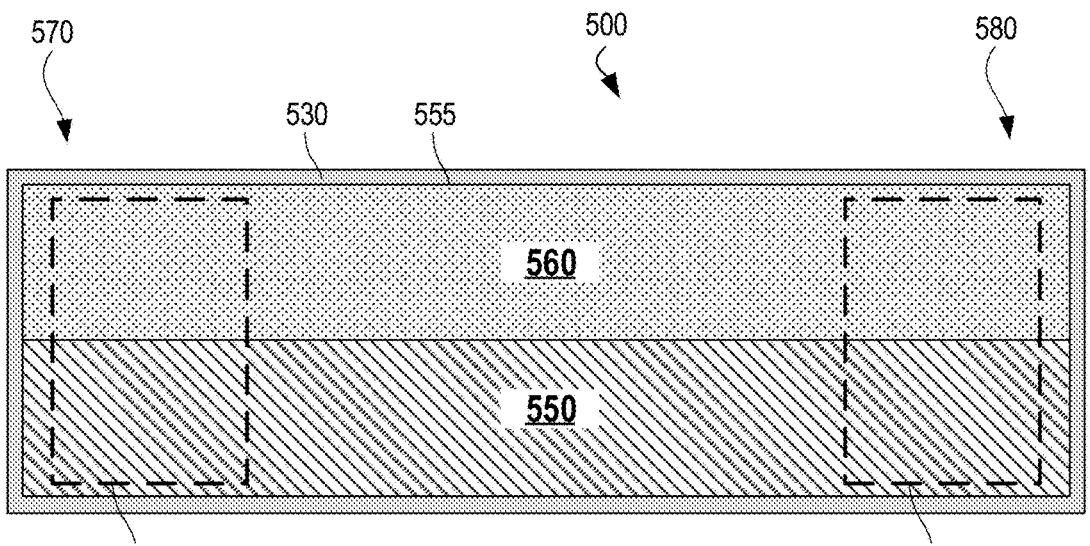

FIGS. 5A-5C illustrate various cross-sectional views of a sixth exemplary heterogeneous heat pipe. FIG. 5A illustrates a longitudinal cross-sectional view of a heterogeneous heat pipe solution comprising a heterogeneous heat pipe 500 thermally coupled to a processor 510 at one end and thermally coupled to a heat sink 520 at the other end. FIGS. 5B and 5C illustrate transverse cross-sectional views of the heterogeneous heat pipe 500 taken along the lines A-A' and B-B', respectively, of FIG. 5A.

The heterogeneous heat pipe 500 comprises a casing 530, a chamber 540 containing a working fluid, and a first wick 550 in parallel with a second wick 560. The first wick 550 is located along a first region of an interior face 555 of the heterogeneous heat pipe 500 extending from a first end 570 of the heterogeneous heat pipe 500 located adjacent to the processor 510 to a second end 580 of the heterogeneous heat pipe 500 located adjacent to the heat sink 520. The second wick 560 is located along a second region of the interior face 555 of the heat pipe extending from the first end 570 to the second end 580. The first wick 550 and the second wick 560 each extend along substantially one-half of an inner perimeter 575 of the heat pipe as shown in the transverse cross-sectional view of FIG. 5B. Although the first wick 550 and the second wick 560 are shown as covering substantially equal portions of the inner perimeter 575 and as collectively covering the an entire length of the inner perimeter 575, in other embodiments, the first wick 550 or the second wick 560 can cover more of less of the inner perimeter 575 than the other wick and/or the wicks can collectively cover less than the entire length of the inner perimeter 575. In other embodiments, a wick can extend along less than the entire longitudinal distance of the interior face 555 of the heat pipe.

The heterogeneous heat pipe 500 comprises a casing 530, a chamber 540 containing a working fluid, and a first wick 550 in parallel with a second wick 560. The first wick 550 is located along a first region of an interior face 555 of the heterogeneous heat pipe 500 that extends from a first end 570 of the heterogeneous heat pipe 500 located adjacent to the processor 510 to a second end 580 of the heterogeneous heat pipe 500 located adjacent to the heat sink 520. The second wick 560 is located along a second region of the interior face 555 of the heat pipe that extends from the first end 570 to the second end 580. The first wick 550 and the second wick 560 each extend along substantially one-half of an inner perimeter 575 of the heat pipe in the transverse cross-sectional view of FIG. 5B. Although the first wick 550 and the second wick 560 are shown as covering substantially equal portions of the inner perimeter 575 and collectively cover the entire length of the inner perimeter 575 of the heat pipe, in other embodiments, the first wick 550 can cover a first portion of the inner perimeter and the second wick 560 can cover a second portion of the inner perimeter 575, with the first portion of the inner perimeter being greater than the second portion of the inner perimeter, or vice versa. In other embodiments, the wicks collectively cover less than the entire length of the interior face 555 of the heat pipe. For example, either one of the wicks may not extend all of the way to either end of the heat pipe or the wicks collectively may extend along only half of the inner perimeter 575 shown in the transverse cross-sectional view of FIG. 5B.

In some embodiments, the casing 530 is made of copper, the working fluid is water, the first wick 550 comprises sintered copper powder and the second wick 560 comprises copper fibers. Thus, the first wick 550 has a lower thermal resistance than the second wick 560 and the second wick 560 has a higher capillary limit than the first wick 550.

The combined wick structure of the heterogeneous heat pipe 500 (the first wick 550 in parallel with the second wick 560) thus provides both a low thermal resistance return path (the first wick 550) for condensate to flow from the heat sink to the processor and a higher resistance return path (the second wick 560) for the condensate once the first wick 550 exhibits a large increase in resistance due to the first wick breaking down as the heat pipe carries heat exceeding the $Q_{max}$ of the first wick 550. In some embodiments, the heterogeneous heat pipe 500 can comprise three or more wicks in parallel, each wick having a different set of wick characteristics (wick material, wick thickness, region of the inner face of the heat pipe covered by the wick, etc.). In other embodiments, the heterogeneous heat pipe 500 can comprise a plurality of working fluids. In some embodiments, a heterogeneous heat pipe solution can comprise multiple heterogeneous heat pipes having different heat pipe characteristics. For example, a heterogeneous heat pipe solution can comprise a first heat pipe with two working fluids and a second heterogeneous heat pipe having two wicks made of different wick materials. In another example, a heterogeneous heat pipe solution can comprise a single heat pipe having three wicks, such as a first wick made of a first wick material and second and third wicks made of a second wick material but having different wick thicknesses.

Figure 6A:
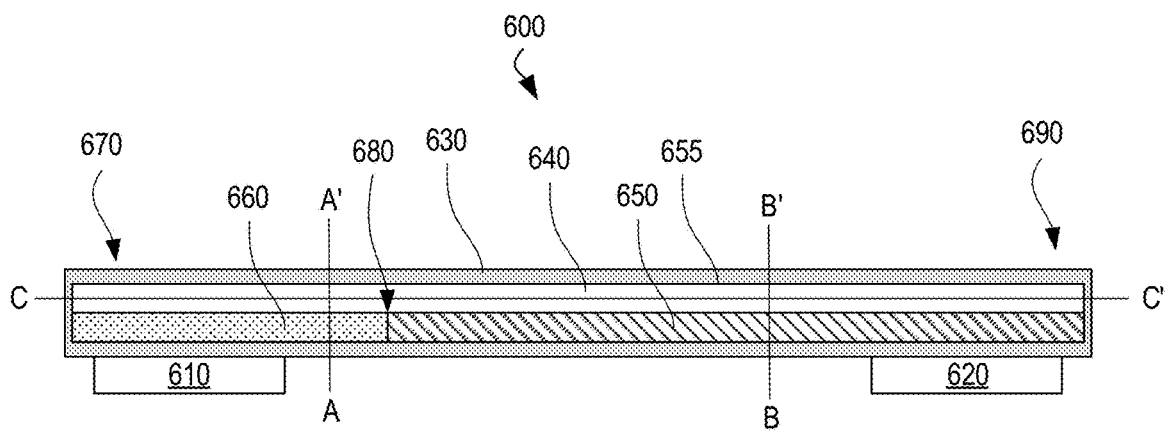
FIGS. 6A-6D illustrate various cross-sectional views of a seventh exemplary heterogeneous heat pipe.
Figure 6B:
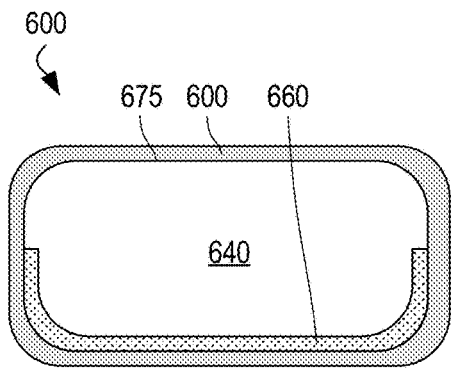
Figure 6C:
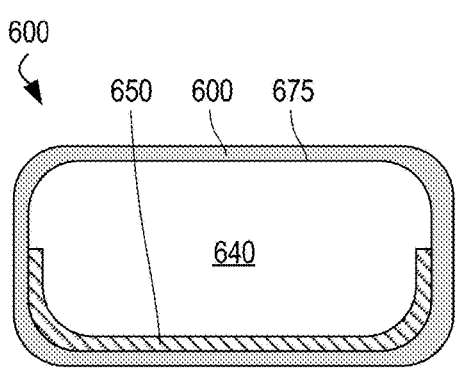
Figure 6D:
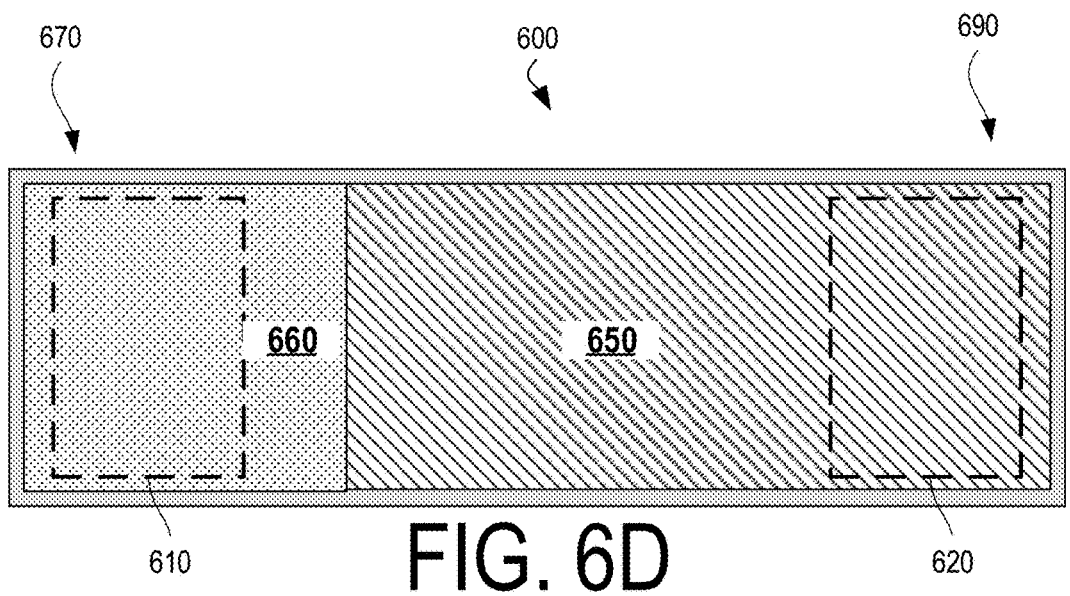

FIGS. 6A-6D illustrate various cross-sectional views of a seventh exemplary heterogeneous heat pipe. FIG. 6A illustrates a longitudinal cross-section of a heterogeneous heat pipe solution comprising a heterogeneous heat pipe 600 connecting a processor 610 to a heat sink 620. FIGS. 6B and 6C illustrate transverse cross-sectional views of the heterogeneous heat pipe 600 taken along the lines A-A' and B-B' of FIG. 6A and FIG. 6D illustrates a longitudinal cross-sectional view of the heterogeneous heat pipe 600 taken along the line C-C' of FIG. 6A. The heterogeneous heat pipe 600 comprises a casing 630, a chamber 640 comprising a working fluid, and a first wick 650 in series with a second wick 660. The first wick 650 is located along a first region of an interior face 655 of the heterogeneous heat pipe 600 that extends from a first end 670 of the heat pipe where the heat pipe attaches to the processor 610 to a point 680 past the region where the heterogeneous heat pipe 600 attaches to the processor 610. The second wick 660 is located along a second region of the interior face 655 of the heterogeneous heat pipe 600 that extends from the point 680 to a second end 690 of the heterogeneous heat pipe 600. The first wick 650 and the second wick 660 each extend along substantially one-half of an inner perimeter 675 of the heat pipe in the transverse cross-sectional views of FIGS. 6B and 6C. In other embodiments the first wick 650 or the second wick 660 can cover the entire the inner perimeter or any portion of the inner perimeter 675 less than an entire length of the inner perimeter 675.

The first wick 650 comprises sintered copper powder and the second wick 660 comprises copper fibers. Thus, the first wick 650 has a lower thermal resistance than the second wick 660 and the second wick 660 has a higher capillary limit than the first wick 650. The combined wick structure of the first wick 650 in series with the second wick thus provides a low thermal resistance to allow for easier evaporation of the working fluid at the first end 670 of the heat pipe and a high capillary limit for carrying the condensed working fluid from the second end 690 to the first wick 650. In some embodiments, the casing 630 is made of copper, the working fluid is water, the first wick 650 comprises sintered copper powder, and the second wick 660 comprises copper fibers.

The heterogeneous heat pipes disclosed herein have at least the following advantages. They have improved thermal performance over homogeneous heat pipes used to transfer heat from heat-generating electronic components in a computing device to a heat sink. Heterogeneous heat pipe solutions have low thermal resistance and a $Q_{max}$ that is high enough to accommodate both maximum steady state and short-term high-performance modes of modern processors. Homogeneous heat pipes are typically optimized for just one of these modes and cannot provide a heat pipe solution that has both low thermal resistance and high $Q_{max}$. (Experimental data shows a strong tradeoff between evaporator resistance when a processor is operating in a steady state and $Q_{max}$ for a processor operating in a short-term high-performance mode.) Thus, heterogeneous heat pipe solutions can be part of a thermal management solution that allows modern processors to operate over their full power range.

The technologies, techniques and embodiments described herein can be performed by any of a variety of computing devices, including mobile devices (e.g., smartphones, handheld computers, tablet computers, laptop computers, media players, portable gaming consoles, cameras and video recorders), non-mobile devices (e.g., desktop computers, servers, stationary gaming consoles, set-top boxes, smart televisions) and embedded devices (e.g., devices incorporated into a vehicle, home or place of business). As used herein, the term "computing devices" includes computing systems and includes devices comprising multiple discrete physical components.

Figure 7:
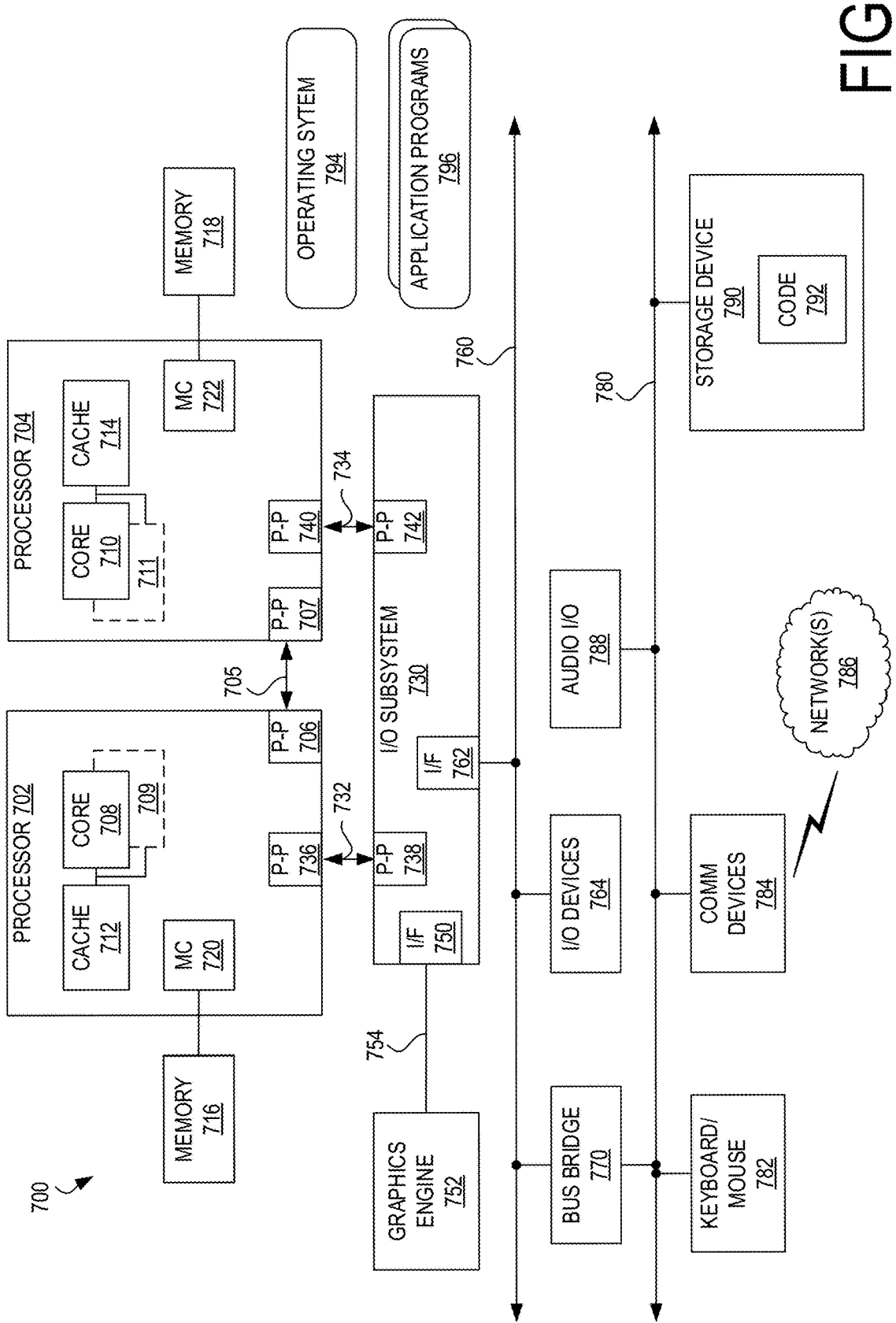
FIG. 7 is a block diagram of an exemplary computing device in which the heterogeneous heat pipes disclosed herein may be utilized.

FIG. 7 is a block diagram of an exemplary computing device in which the heterogeneous heat disclosed herein may be utilized. Generally, components shown in FIG. 7 can communicate with other shown components, although not all connections are shown, for ease of illustration. The device 700 is a multiprocessor system comprising a first processor 702 and a second processor 704 and is illustrated as comprising point-to-point (P-P) interconnects. For example, a point-to-point (P-P) interface 706 of the processor 702 is coupled to a point-to-point interface 707 of the processor 704 via a point-to-point interconnection 705. It is to be understood that any or all of the point-to-point interconnects illustrated in FIG. 7 can be alternatively implemented as a multi-drop bus, and that any or all buses illustrated in FIG. 7 could be replaced by point-to-point interconnects.

As shown in FIG. 7, the processors 702 and 704 are multicore processors. Processor 702 comprises processor cores 708 and 709, and processor 704 comprises processor cores 710 and 711. Processor cores 708-711 can execute computer-executable instructions in a manner similar to that discussed below in connection with FIG. 7, or in other manners.

Processors 702 and 704 further comprise at least one shared cache memory 712 and 714, respectively. The shared caches 712 and 714 can store data (e.g., instructions) utilized by one or more components of the processor, such as the processor cores 708-709 and 710-711. The shared caches 712 and 714 can be part of a memory hierarchy for the device 700. For example, the shared cache 712 can locally store data that is also stored in a memory 716 to allow for faster access to the data by components of the processor 702. In some embodiments, the shared caches 712 and 714 can comprise multiple cache layers, such as level 1 (L1), level 2 (L2), level 3 (L3), level 4 (L4), and/or other caches or cache layers, such as a last level cache (LLC).

Although the device 700 is shown with two processors, the device 700 can comprise any number of processors. Further, a processor can comprise any number of processor cores. A processor can take various forms such as a central processing unit, a controller, a graphics processor, an accelerator (such as a graphics accelerator, digital signal processor (DSP), or AI accelerator)). A processor in a device can be the same as or different from other processors in the device. In some embodiments, the device 700 can comprise one or more processors that are heterogeneous or asymmetric to a first processor, accelerator, FPGA, or any other processor. There can be a variety of differences between the processing elements in a system in terms of a spectrum of metrics of merit including architectural, microarchitectural, thermal, power consumption characteristics and the like. These differences can effectively manifest themselves as asymmetry and heterogeneity amongst the processors in a system. In some embodiments, the processors 702 and 704 reside in the same die package.

Processors 702 and 704 further comprise memory controller logic (MC) 720 and 722. As shown in FIG. 7, MCs 720 and 722 control memories 716 and 718 coupled to the processors 702 and 704, respectively. The memories 716 and 718 can comprise various types of memories, such as volatile memory (e.g., dynamic random access memories (DRAM), static random access memory (SRAM)) or non-volatile memory (e.g., flash memory, solid-state drives, chalcogenide-based phase-change non-volatile memories). While MCs 720 and 722 are illustrated as being integrated into the processors 702 and 704, in alternative embodiments, the MCs can be logic external to a processor, and can comprise one or more layers of a memory hierarchy.

Processors 702 and 704 are coupled to an Input/Output (I/O) subsystem 730 via P-P interconnections 732 and 734. The point-to-point interconnection 732 connects a point-to-point interface 736 of the processor 702 with a point-to-point interface 738 of the I/O subsystem 730, and the point-to-point interconnection 734 connects a point-to-point interface 740 of the processor 704 with a point-to-point interface 742 of the I/O subsystem 730. Input/Output subsystem 730 further includes an interface 750 to couple I/O subsystem 730 to a graphics engine 752, which can be a high-performance graphics engine. The I/O subsystem 730 and the graphics engine 752 are coupled via a bus 754. Alternately, the bus 754 could be a point-to-point interconnection.

Input/Output subsystem 730 is further coupled to a first bus 760 via an interface 762. The first bus 760 can be a Peripheral Component Interconnect (PCI) bus, a PCI Express bus, another third generation I/O interconnection bus or any other type of bus.

Various I/O devices 764 can be coupled to the first bus 760. A bus bridge 770 can couple the first bus 760 to a second bus 780. In some embodiments, the second bus 780 can be a low pin count (LPC) bus. Various devices can be coupled to the second bus 780 including, for example, a keyboard/mouse 782, audio I/O devices 788 and a storage device 790, such as a hard disk drive, solid-state drive or other storage device for storing computer-executable instructions (code) 792. The code 792 can comprise computer-executable instructions for performing technologies described herein. Additional components that can be coupled to the second bus 780 include communication device(s) 784, which can provide for communication between the device 700 and one or more wired or wireless networks 786 (e.g. Wi-Fi, cellular or satellite networks) via one or more wired or wireless communication links (e.g., wire, cable, Ethernet connection, radio-frequency (RF) channel, infrared channel, Wi-Fi channel) using one or more communication standards (e.g., IEEE 702.11 standard and its supplements).

The device 700 can comprise removable memory such as flash memory cards (e.g., SD (Secure Digital) cards), memory sticks, Subscriber Identity Module (SIM) cards). The memory in device 700 (including caches 712 and 714, memories 716 and 718 and storage device 790) can store data and/or computer-executable instructions for executing an operating system 794 and application programs 796. Example data includes web pages, text messages, images, sound files, video data, or other data sets to be sent to and/or received from one or more network servers or other devices by the device 700 via one or more wired or wireless networks, or for use by the device 700. The device 700 can also have access to external memory (not shown) such as external hard drives or cloud-based storage.

The operating system 794 can control the allocation and usage of the components illustrated in FIG. 7 and support one or more application programs 796. The application programs 796 can include common mobile computing device applications (e.g., email applications, calendars, contact managers, web browsers, messaging applications) as well as other computing applications.

The device 700 can support various input devices, such as a touchscreen, microphone, monoscopic camera, stereoscopic camera, trackball, touchpad, trackpad, mouse, keyboard, proximity sensor, light sensor, electrocardiogram (ECG) sensor, PPG (photoplethysmogram) sensor, galvanic skin response sensor, and one or more output devices, such as one or more speakers or displays. Other possible input and output devices include piezoelectric and other haptic I/O devices. Any of the input or output devices can be internal to, external to or removably attachable with the device 700. External input and output devices can communicate with the device 700 via wired or wireless connections.

In addition, the computing device 700 can provide one or more natural user interfaces (NUIs). For example, the operating system 794 or applications 796 can comprise speech recognition logic as part of a voice user interface that allows a user to operate the device 700 via voice commands.

Further, the device 700 can comprise input devices and logic that allows a user to interact with the device 700 via a body, hand or face gestures.

The device 700 can further comprise one or more communication components 784. The components 784 can comprise wireless communication components coupled to one or more antennas to support communication between the device 700 and external devices. The wireless communication components can support various wireless communication protocols and technologies such as Near Field Communication (NFC), IEEE 1002.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM). In addition, the wireless modems can support communication with one or more cellular networks for data and voice communications within a single cellular network, between cellular networks, or between the mobile computing device and a public switched telephone network (PSTN).

The device 700 can further include at least one input/output port (which can be, for example, a USB, IEEE 1394 (FireWire), Ethernet and/or RS-232 port) comprising physical connectors; a power supply (such as a rechargeable battery); a satellite navigation system receiver, such as a GPS receiver; a gyroscope; an accelerometer; a proximity sensor; and a compass. A GPS receiver can be coupled to a GPS antenna. The device 700 can further include one or more additional antennas coupled to one or more additional receivers, transmitters and/or transceivers to enable additional functions.

It is to be understood that FIG. 7 illustrates only one exemplary computing device architecture. Computing devices based on alternative architectures can be used to implement technologies described herein. For example, instead of the processors 702 and 704, and the graphics engine 752 being located on discrete integrated circuits, a computing device can comprise a SoC (system-on-a-chip) integrated circuit incorporating multiple processors, a graphics engine and additional components. Further, a computing device can connect elements via bus or point-to-point configurations different from that shown in FIG. 7. Moreover, the illustrated components in FIG. 7 are not required or all-inclusive, as shown components can be removed and other components added in alternative embodiments.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following examples pertain to additional embodiments of technologies disclosed herein.

Example 1 is a computing device comprising: a processor; a heat sink; one or more first heat pipes, individual of the first heat pipes thermally coupled to the processor at a first end of the individual first heat pipe and thermally coupled to the heat sink at a second end of the individual first heat pipe; and one or more second heat pipes, individual of the second heat pipes thermally coupled to the processor at a first end of the individual second heat pipe and thermally coupled to the heat sink at a second end of the individual second heat pipe; wherein individual of the first heat pipes have a first thermal resistance and a first $Q_{max}$, individual of the second heat pipes have a second thermal resistance and a second $Q_{max}$, the first thermal resistance lower than the second thermal resistance, and the first $Q_{max}$ lower than the second $Q_{max}$.

Example 2 is the computing device of Example 1, wherein individual of the first heat pipes comprise a first wick material and individual of the second heat pipes comprise a second wick material, the first wick material different than the second wick material.

Example 3 is the computing device of Example 1, wherein individual of the first heat pipes comprise a wick material having a first thickness and individual of the second heat pipes comprise the wick material having a second thickness, the first thickness different than the second thickness.

Example 4 is the computing device of Example 1, wherein individual of the first heat pipes have a first transverse cross-sectional area and individual of the second heat pipes have a second transverse cross-sectional, the first transverse cross-sectional area different than the second transverse cross-sectional area.

Example 5 is the computing device of Example 1, wherein individual of the first heat pipes comprise a first working fluid and individual of the second heat pipes comprise a second working fluid, the first working fluid different than the second working fluid.

Example 6 is the computing device of Example 1, wherein individual of the first heat pipes comprise a working fluid charged to a first charging level and individual of the second heat pipes comprise the working fluid charged to a second charging level.

Example 7 is the computing device of Example 6, wherein the first charging level corresponds to a first mode of the processor and the second charging level corresponds to a second mode of the processor.

Example 8 is the computing device of Example 7, wherein the first mode of the processor is a steady state mode and the second mode of the processor is a short-term high-performance mode.

Example 9 is the computing device of Example 1, wherein individual of the first heat pipes comprise a first casing material and individual of the second heat pipes comprise a second casing material, the first casing material different than the second casing material.

Example 10 is the computing device of Example 1 wherein the first heat pipes comprise a plurality of first heat pipes and the second heat pipes comprise a plurality of second pipes, the first heat pipes interleaved with the second heat pipes.

Example 11 is the computing device of Example 1, wherein the processor is capable of operating in a short-term high-performance mode and the first $Q_{max}$ is less than a power consumption level of the processor when the processor is operating in the short-term high-performance mode.

Example 12 is the computing device of Example 1, further comprising one or more memories communicatively coupled to the processor.

Example 13 is the computing device of Example 1, comprising one or more third heat pipes, individual of the third heat pipes thermally coupled to the processor at a first end of the individual third heat pipe and thermally coupled to the heat sink at a second end of the individual third heat pipe, wherein individual of the third heat pipes have a third thermal resistance different from the first thermal resistance and the second thermal resistance and a third $Q_{max}$ different from the first $Q_{max}$ and the second $Q_{max}$.

Example 14 is a computing device comprising: a processor; a heat sink; and a heat pipe thermally coupled to the processor at a first end of the heat pipe and thermally coupled to the heat sink at a second end of the heat pipe, the heat pipe comprising a first wick located along a first region of an interior face of the heat pipe and a second wick located along a second region of the interior face of the heat pipe.

Example 15 is the computing device of Example 14, wherein the first wick comprises a first wick material, the second wick comprises a second wick material, the first wick material different than the second wick material.

Example 16 is the computing device of Example 14, wherein the first wick has a first thickness and the second wick has a second thickness, the first thickness different than the second thickness.

Example 17 is the computing device is Example 14, wherein the heat pipe further comprises a plurality of working fluids.

Example 18 is the computing device of Example 15, wherein the first wick material comprises sintered copper and the second wick material comprises copper fibers.

Example 19 is the computing device of Example 14, wherein the first region of the interior face of the heat pipe extends along a first portion of an inner perimeter of the heat pipe from substantially a first end of the heat pipe located adjacent to the processor to substantially a second end of the heat pipe located adjacent to the heat sink and the second region of the interior face of the heat pipe extends along a second portion of the inner perimeter of the heat pipe from substantially the first end of the heat pipe to substantially the second end of the heat pipe.

Example 20 is the computing device of Example 19, wherein the first portion of the inner perimeter covers more of the inner perimeter than the second portion of the inner perimeter.

Example 21 is the computing device of Example 19, wherein the first portion of the inner perimeter covers less of the inner perimeter than the second portion of the inner perimeter.

Example 22 is the computing device of Example 19, wherein the first portion of the inner perimeter and the second portion of the inner perimeter collectively cover less than the entire inner perimeter.

Example 23 is the computing device of Example 14, wherein the first region of the interior face of the heat pipe extends from substantially a first end of the heat pipe where the heat pipe attaches to the processor to a point along a length of the heat pipe past where the heat pipe attaches to the processor and the second region of the interior of the heat pipe extends from substantially a second end of the heat pipe located adjacent to the heat sink to the first point.

Example 24 is the computing device of Example 19, further comprising one or more memories communicatively coupled to the one or more processors.

Example 25 is a computing device comprising: a processor; a heat sink; a first heat transfer means to transfer heat from the processor to the heat sink; and a second heat transfer means to transfer heat from the processor to the heat sink, the first heat transfer means in parallel with the second heat transfer means; wherein the first heat transfer means has a first thermal resistance and a first $Q_{max}$, the second heat transfer means has a second thermal resistance and a second $Q_{max}$, the first thermal resistance less than the second thermal resistance, the first $Q_{max}$ less than the second $Q_{max}$.

Example 26 is the computing device of Example 25, wherein the processor is capable of operating in a short-term high-performance mode and the first $Q_{max}$ is less than a power consumption level of the processor when the processor is operating in the short-term high-performance mode.

Example 27 is a computing device comprising: a processor; a heat sink; and a heat transfer means to transfer heat from the processor to the heat sink, a first portion of the heat transfer means having a first thermal performance tailored for when the processor is operating in a first mode, a second portion of the heat transfer means having a second thermal performance tailored for when the processor is operating in a second mode.

Example 28 is the computing device of Example 27, wherein the first operation mode is a maximum steady state mode and the second mode is a short-term high-performance mode.

Example 29 is a heterogeneous heat pipe comprising: a casing; a working fluid; a first wick located along a first region of an interior face of the heterogeneous heat pipe; and a second wick located along a second region of the interior face of the heat pipe.

Example 30 is the heterogeneous heat pipe of Example 29, wherein the first wick comprises a first wick material, the second wick comprises a second wick material, the first wick material different than the second wick material.

Example 31 is the heterogeneous heat pipe of Example 29, wherein the first wick has a first thickness and the second wick has a second thickness, the first thickness different than the second thickness.

Example 32 is the heterogeneous heat pipe of Example 29, wherein the first wick material comprises sintered copper and the second wick material comprises copper fibers.

Example 33 is the heterogeneous heat pipe of Example 29, wherein the first region of the interior face of the heat pipe extends along a first portion of an inner perimeter of the heat pipe from substantially a first end of the heat pipe to substantially a second end of the heat pipe and the second region of the interior face of the heat pipe extends along a second portion of the inner perimeter of the heat pipe from substantially the first end of the heat pipe to substantially the second end of the heat pipe.

Example 34 is the heterogeneous heat pipe of Example 33, wherein the first portion of the inner perimeter covers more of the inner perimeter than the second portion of the inner perimeter.

Example 35 is the heterogeneous heat pipe of Example 33, wherein the first portion of the inner perimeter covers less of the inner perimeter than the second portion of the inner perimeter.

Example 36 is the heterogeneous heat pipe of Example 33, wherein the first portion of the inner perimeter and the second portion of the inner perimeter cover less than the entire inner perimeter.

Example 37 is the heterogeneous heat pipe of Example 29, wherein the first region of the interior face of the heat pipe extends from substantially a first end of the heat pipe to a point along the length of the heat pipe and the second region of the interior of the heat pipe extends from substantially a second end of the heat pipe to the first point.

We claim:

1. A computing device comprising:
a processor;
a heat sink;
a plurality of first heat pipes, individual of the plurality of first heat pipes thermally coupled to the processor at a first end of the individual first heat pipe and thermally coupled to the heat sink at a second end of the individual first heat pipe;
a plurality of second heat pipes, individual of the plurality of second heat pipes thermally coupled to the processor at a first end of the individual second heat pipe and thermally coupled to the heat sink at a second end of the individual second heat pipe; and
a plurality of third heat pipes, individual of the plurality of third heat pipes thermally coupled to the processor at a first end of the individual third heat pipe and thermally coupled to the heat sink at a second end of the individual third heat pipe;
wherein:
individual of the plurality of first heat pipes have a first thermal resistance and a first $Q_{max}$, individual of the plurality of second heat pipes have a second thermal resistance and a second $Q_{max}$, the first thermal resistance lower than the second thermal resistance, and the first $Q_{max}$ lower than the second $Q_{max}$;
the plurality of first heat pipes is interleaved with the plurality of second heat pipes, wherein no first heat pipe is positioned adjacent to another first heat pipe and no second pipe is positioned adjacent to another second heat pipe;
individual of the plurality of third heat pipes have a third thermal resistance different from the first thermal resistance and the second thermal resistance and a third $Q_{max}$ different from the first $Q_{max}$ and the second $Q_{max}$; and
the plurality of third heat pipes is interleaved with the plurality of first heat pipes and the plurality of second heat pipes.

2. The computing device of claim 1, wherein individual of the plurality of first heat pipes comprise a first wick material and individual of the plurality of second heat pipes comprise a second wick material, the first wick material different than the second wick material.

3. The computing device of claim 1, wherein individual of the plurality of first heat pipes comprise a wick material having a first thickness and individual of the plurality of second heat pipes comprise the wick material having a second thickness, the first thickness different than the second thickness.

4. The computing device of claim 1, wherein individual of the plurality of first heat pipes have a first transverse cross-sectional area and individual of the plurality of second heat pipes have a second transverse cross-sectional area, the first transverse cross-sectional area different than the second transverse cross-sectional area.

5. The computing device of claim 1, wherein individual of the plurality of first heat pipes comprise a first working fluid and individual of the plurality of second heat pipes comprise a second working fluid, the first working fluid different than the second working fluid.

6. The computing device of claim 1, wherein individual of the plurality of first heat pipes comprise a working fluid charged to a first charging level and individual of the plurality of second heat pipes comprise the working fluid charged to a second charging level.

7. The computing device of claim 6, wherein the first charging level corresponds to a first mode of the processor and the second charging level corresponds to a second mode of the processor.

8. The computing device of claim 7, wherein the first mode of the processor is a steady state mode and the second mode of the processor is a short-term high-performance mode.

9. The computing device of claim 1, wherein the processor is capable of operating in a short-term high-performance mode and the first $Q_{max}$ is less than a power consumption level of the processor when the processor is operating in the short-term high-performance mode.

10. The computing device of claim 1, further comprising one or more memories communicatively coupled to the processor.

11. The computing device of claim 1, wherein individual of the plurality of first heat pipes comprise a first casing material and individual of the plurality of second heat pipes comprise a second casing material, the first casing material different than the second casing material.

* * * * *